United States Patent [19]

Jackson et al.

[11] 4,054,951
[45] Oct. 18, 1977

[54] DATA EXPANSION APPARATUS

[75] Inventors: Rory D. Jackson, Fishkill; Willi K. Rackl, Poughkeepsie, both of N.Y.

[73] Assignee: International Business Machines Corporation, Armonk, N.Y.

[21] Appl. No.: 701,325

[22] Filed: June 30, 1976

[51] Int. Cl.² ............................................. G06F 3/14
[52] U.S. Cl. ................................................. 364/900
[58] Field of Search ......................... 340/172.5; 445/1

[56] References Cited
U.S. PATENT DOCUMENTS

| 3,438,003 | 4/1969 | Bryan | 340/172.5 |
| 3,717,851 | 2/1973 | Cocke et al. | 340/172.5 |
| 3,936,808 | 2/1976 | O'Neill, Jr. | 340/172.5 |
| 3,946,365 | 3/1976 | Bantner | 340/172.5 |
| 3,949,377 | 4/1976 | O'Neill | 364/900 |

Primary Examiner—Harvey E. Springborn
Attorney, Agent, or Firm—Edward S. Gershuny

[57] ABSTRACT

When a data stream includes long sections of data that are repeated periodically, storage space may be saved by not including full repetitions of such sections in the storage. However, when the data is to be read from storage for utilization, the omitted repetitious sections must be inserted. This is accomplished by providing hardware apparatus which recognizes a particular flag occurring in the stored data. After recognizing the flag, the expansion apparatus interprets the next piece of information in the data stream as being the storage address of the start of a section of data that is to be inserted into the data stream; the next piece of information is interpreted as being the length of the section of data to be inserted; and the next following piece of information is the number of times that the section of data is to be inserted. The apparatus will respond to the flag and its associated indicators by inserting the appropriate data section the indicated number of times.

5 Claims, 5 Drawing Figures

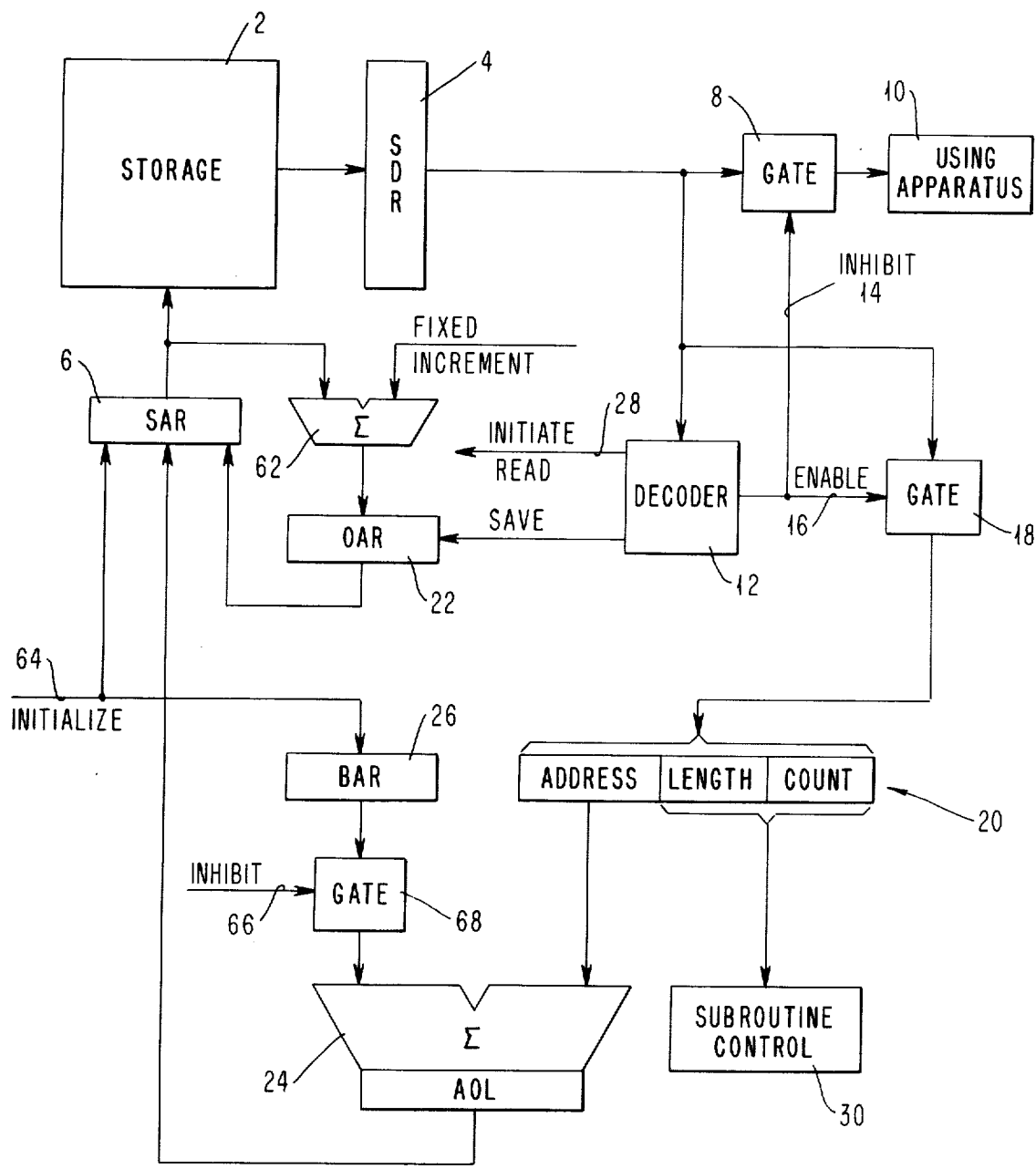
FIG. 1
FIG. 3
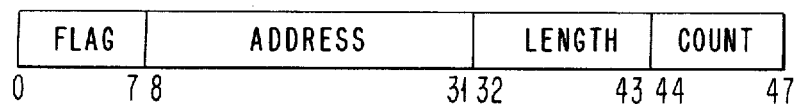

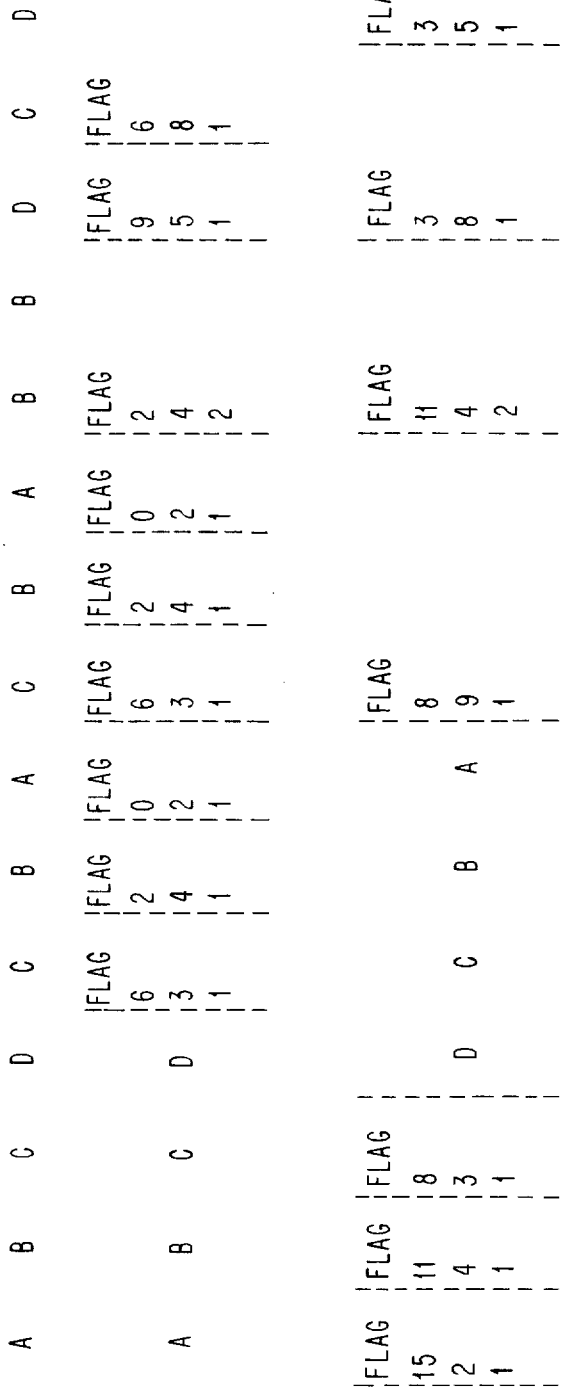

DATA EXPANSION APPARATUS

DETAILED DESCRIPTION

BACKGROUND OF THE INVENTION

This invention relates to apparatus for expanding data that has geen compacted. More particularly, the invention relates to apparatus for data expansion which is particularly useful in systems wherein long data sections of varying lengths are repetitively used varying numbers of times.

In systems such as the one described in U.S. Pat. No. 3,644,700 for "Method And Apparatus For Controlling An Electron Beam" by R. V. Kruppa, long sections of the same data are repetitively used over and over again. The data used to control an electron beam are typically stored initially on a magnetic disk, from which they are read into in a memory buffer. From the buffer they are again read out and used for control of the beam. In a typical prior art system such as the one shown in the patent, beam control data are read from a disk into the buffer, these data are used for beam control, and then the next block of beam control data is read from the disk into the buffer. The amount of time that is taken for reading data from the disk into the buffer is a significant throughout limiting factor. Also, a significant amount of space on the disks can be required to hold all of the pattern data.

BRIEF DESCRIPTION OF THE INVENTION

This invention provides apparatus for expanding compacted data. In accordance with one aspect of the invention, while reading from the buffer, the apparatus responds to a particular configuration within the data stream, which configuration has replaced one or more repetitive data sections. The configuration includes: a flag which uniquely identifies it to the apparatus; an address representing the location in storage of the repetitive data section; the length of the data section; and the number of times it is to be repeated. The expansion apparatus responds to the above data format by inserting in place thereof the appropriate beam control data.

The primary advantage of this invention is that, by permitting the buffer (and other intermediate storage devices) to store compressed data, it enables the buffer to store a larger amount of beam control data.

This leads to the further advantage that the buffer will need to be refilled from a disk less often than would otherwise be necessary. Since the disk-to-buffer operation is somewhat time consuming, use of this invention will increase throughput in the type of system mentioned above.

It should also be noted that, with this invention, the compacted data need not contain any particular coded indications of the beginning or end of sections of data. All of the information necessary to locate the beginning and end of a data section is contained in the information which immediately follows the identifying flag. This leads to the additional advantage that the repetitive data sections need not bear any particular relation to each other: that is, any two particular data sections could be completely separated from one another in storage, or they could partially overlap one another, or one could be completely included within the other.

The foregoing and other features and advantages of the invention will be apparent from the following more particular description of preferred embodiments of the invention as illustrated in the accompanying drawing.

In the drawings:

FIG. 1 is a schematic block diagram of a portion of a control system which embodies this invention.

FIG. 3 shows the format of the flag which is inserted into the data stream for compaction.

FIG. 5 shows examples of compacted data.

DETAILED DESCRIPTION

Figure 2:
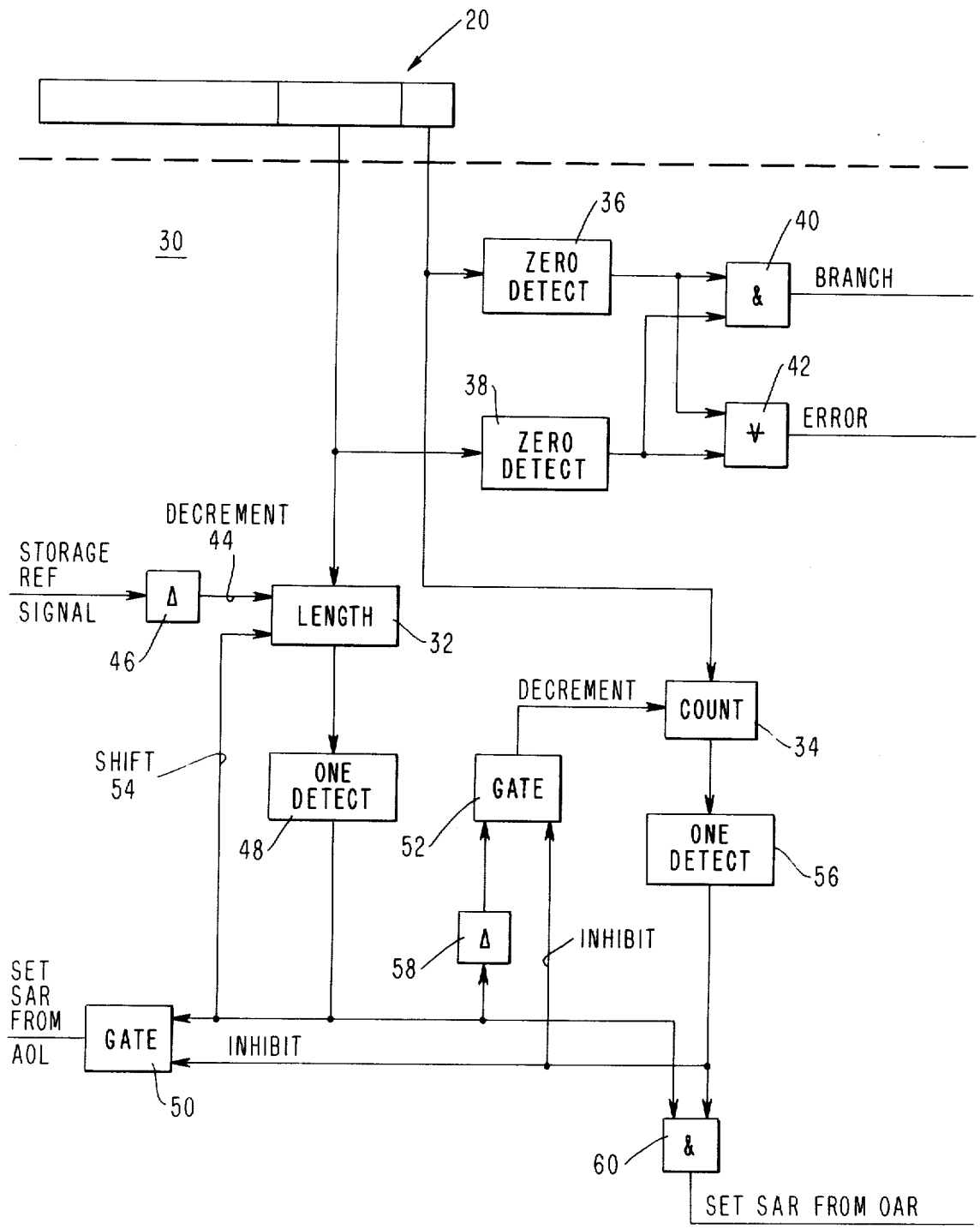
FIG. 2 shows an example of mechanism which could be used for keeping track of the length of a data section and of the number of times it has been inserted in the data stream.

FIG. 1 shows various aspects of a system embodying this invention. A storage unit 2 is presumed to contain compacted data which may have been loaded into it from a disk or other bulk storage medium (not shown). Associated with the storage unit 2 is a storage data register SDR 4 through which data moves out of the storage unit. The storage unit is addressed by a storage address register SAR 6. Data read from the storage unit 2 will be gated through gate 8 to some apparatus 10 which will use the data. This apparatus could, for example, be the pattern input buffer of an electron beam control system, the central processing unit of a computer, etc. As data goes out of storage, it is examined by a decoder 12 which continually checks for the particular pattern or patterns of bits that identify a situation where the data needs to be expanded. This pattern is referred to as a "flag."

When the decoder 12 detects an expansion flag, it will produce a signal on line 14 to inhibit gate 8 from permitting passage of data from the storage 2 to the using apparatus 10. The same signal that was used to inhibit gate 8 will, via line 16, enable another gate 18 to cause data to be passed from storage to a subroutine register 20. As will be described in more detail below, the data in subroutine register 20 will control insertion of repetitious data sections into the data stream.

In response to the flag, decoder 12 also causes the contents of SAR 6 to be saved in an "old address register" OAR 22. This will subsequently enable normal transmission to resume at the proper address. Address information contained in subroutine register 20 may be passed through an adder 24, where it may be combined with additional address information contained in a base address register BAR 26, and into the SAR 6. The decode mechanism 12 will then, via line 28, generate a storage read signal. After subroutine register 20 has been loaded, decoder 12 will generate signals on lines 14 and 16 to enable gate 8 (to pass data from storage 2 to the using apparatus 10) and disable gate 18. Reading of data from storage 2 to the using apparatus 10 will then commence. Data will be read from the storage unit commencing at the address supplied to the SAR 6. Information concerning the length of the data section to be read, and the number of times that it is to be read, will be supplied from the subroutine register 20 to a subroutine control mechanism 30.

After the appropriate data section has been inserted into the data stream from storage 2 to using apparatus 10 an appropriate number of times, the subroutine control 30 will cause the contents of OAR 22 to be transferred into the SAR 6 and normal processing will again continue.

Referring now to FIG. 3, the format of an "instruction" which causes data expansion is shown. (The word "instruction" is used in its very generic sense to refer to a pattern of bits that initiates a particular action in the hardware apparatus). The instruction comprises four fields utilizing a total of 48 bits. The first 8 bits are the flag which is detected by the decoder 12 to cause initiation of data expansion. The next 24 bits represent the starting address in storage of the data section that is to be inserted in the data stream. The next 12 bits are the length of the data section, and the last 4 bits represent the number of times that the data section is to be repeated. Using the configuration shown in FIG. 3, data sections containing up to 4095 units of information may be inserted as many as 15 times in response to one of these instructions. The precise meaning of a "unit of information" will depend upon the system in which this invention is implemented, particularly upon the storage 2 and the manner in which it is addressed. For example, the unit of information could be a bit, a byte, a word, etc. The 40 bits comprising the address, length and count fields shown in FIG. 3 are the bits that are transmitted to the subroutine register 20 shown in FIG. 1.

Referring now to FIG. 2, there is shown one embodiment of a mechanism that could be used to implement the subroutine control 30. The length data held in subroutine register 20 will be transferred to a length register 32 and the count informtion held in subroutine register 20 will be transferred to a count register 34. During this transfer, both the length and count fields will be checked by zero detect circuits 36 and 38, respectively, to determine whether either or both of these fields contains a zero. In the preferred embodiment of this invention, zeros in both the length and count fields will be used to signify an unconditional change in the contents of SAR 6 with subsequent continuation of processing. This is similar to a programmed unconditional branch instruction. Zeros in both of these fields will be detected by AND circuit 40 which will produce the branch signal at its output. If one, but not both, of the length and count fields contains a zero, an error condition will be signalled by the output of Exclusive-Or circuit 42.

If neither of the length and count fields is zero, reading will commence from storage 2 at the address specified in SAR 6. With each storage reference, a signal on line 44 will cause the contents of length register 32 to be decremented by one. The decrement signal appearing on line 44 is preferably derived through a delay 46 from the storage reference signal which causes a readout from storage 2. Thus, the contents of length register 32 will be decremented to "one" a very short time after the last data unit in the sqeuence has been read from storage. At this time, if count register 34 does not contain a one, a signal from one-detector 48 will: pass through gate 50 to again set SAR 6 from the adder output latches AOL of adder 24; pass through gate 52 to decrement the count register 34; and present a signal on line 54 to cause the contents of length counter 32 to be set again from the subroutine register 20. This sequence will continue until count register 34 is finally decremented to one.

When count register 34 is decremented to one, one-detector 56 will produce a signal which inhibits gate 50 (preventing a further attempt to set SAR 6 from the adder output latches) and inhibits gate 52 (preventing further decrementation of count register 34). In order to prevent the possibility of a "race condition" caused by premature occurrence of an output from one-detector 56, it will be desirable to include a delay 58 in the path of the signal which decrements count register 34.

After count register 34 has been decremented to one, subsequent decrementation to one of length register 32 will produce a concurrence of outputs from detectors 48 and 56, both of which feed the inputs of AND 60. This concurrence will result in a signal from AND 60 which will be utilized to transfer the contents of OAR 22 into SAR 6 so that the system can proceed with normal transmission of data from storage 2 to the using apparatus 10. (Those skilled in the art will recognize that, depending upon the particular environment in which this invention is implemented, the contents of OAR 22 will not necessarily be exactly the address that needs to be transferred in SAR 6 in order for normal processing to continue. However, in a typical system, any necessary alteration of the OAR 22 contents prior to transfer to the SAR 6 will simply be a matter of incrementing the contents of OAR 22 by a known fixed amount. One manner of achieving this incrementation would be to insert an adder 62 in the path between SAR 6 and OAR 22 as shown in FIG. 1 so that the address going into OAR 22 is the address that will actually be needed to subsequently return the system to its normal processing mode.)

All of the elements shown in FIG. 2 are items that are well known in the art and need not be described in detail herein. For example, detectors 36, 38, 48 and 56 could simply be implemented as comparators, each of which receives a first input from an element as shown in FIG. 2. The second input of each of the detectors 36 and 38 would be a fixed zero; the second input of each of detectors 48 and 56 would be a fixed one.

Figure 4:
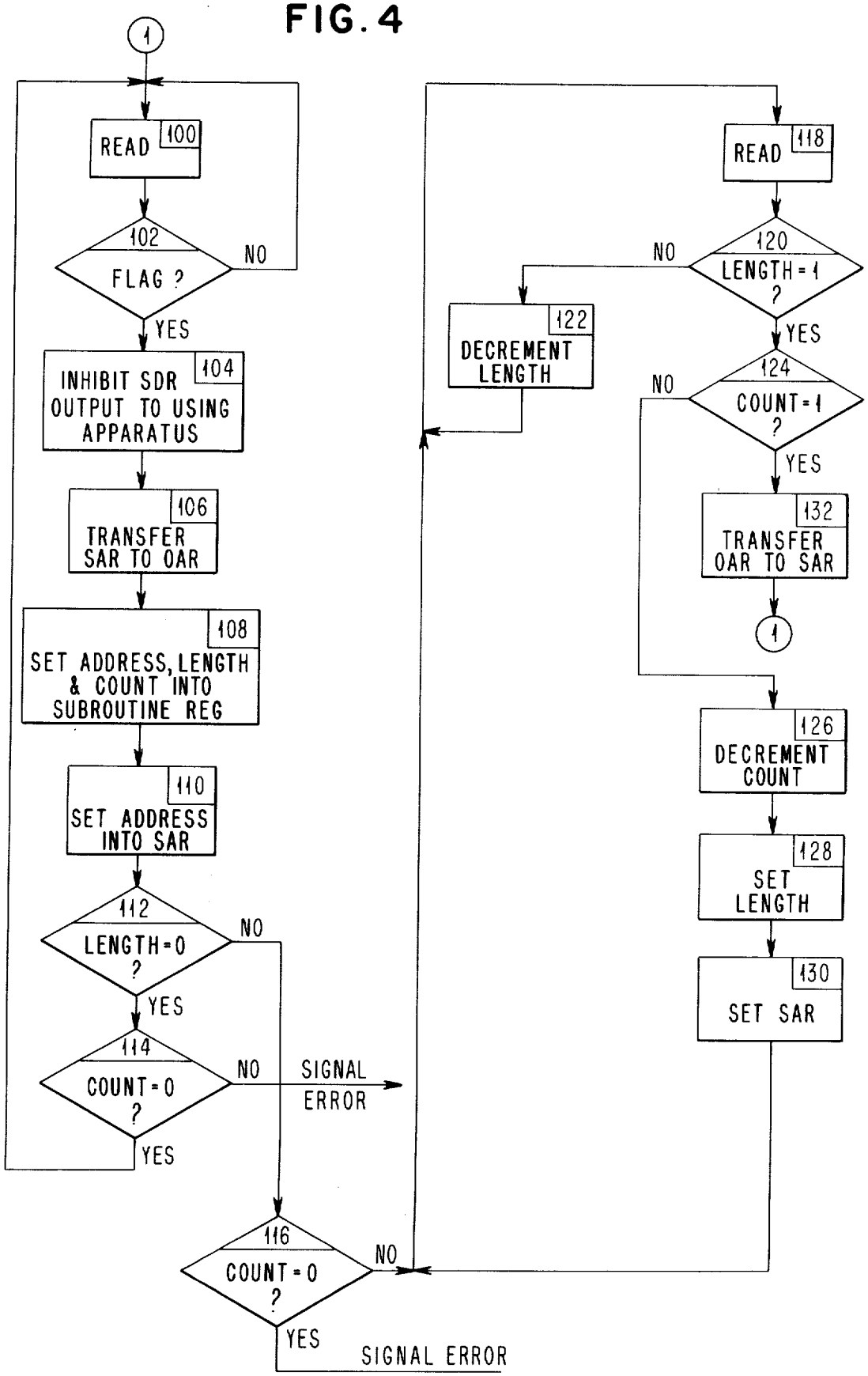
FIG. 4 is a flow diagram showing the sequence of operations performed by a system embodying the invention.

Referring now to FIG. 4, the sequence of operations of this invention is shown. As information is read from storage (block 100) it is checked (block 102) to see whether or not it contains a flag indicating that data expansion is required. When a flag is detected, the output of the storage data register will be inhibited from being transmitted to the using apparatus (block 104). The contents of the storage address register will be transferred into the old address register (block 106), with appropriate incrementing if necessary. Approximately in parallel with the latter operation, address, length and count information will be transferred to the subroutine register (block 108). The address information in the subroutine register will then, with any necessary incrementation, be transferred to the storage address register (block 110). The length and count information will be checked to see if either or both is equal to zero (blocks 112, 114 and 116). If both are equal to zero, the sequence will return to block 100 for continuation of normal data transmission with a new address in the storage address register. If only one of the length or count is equal to zero, an error signal will be generated. If neither the count nor the length is equal to zero, a unit of data will be read from storage (block 118). After reading a unit of data, if the length register does not contain one (block 120), it will be decremented (block 122) and another unit of data will be read (block 118). When the length register does contain a one (block 120), but the count register does not yet contain a one (block 124); the count register will be decremented (block 126), the length register will be set again from the subroutine register (block 128), and the storage address register will be set (block 130) from the adder output latches (or directly from the subroutine register if incrementation capability is not included in the implementation) and the first unit of data in the data sequence will again be read from storage (block 118). When the contents of the length register has been decremented to one (block 120) after the contents of the count register also has been decremented to one (block 124) the data expansion will have been completed. Then, the contents of the old address register will be transferred to the storage address register (block 132) and normal transmission of data from storage will continue (block 100).

Referring now to FIG. 5, manners are shown in which data could have been compacted for use with this invention. The first line of FIG. 5 shows a data sequence ABCDCBACBABBDCD, wherein each of the letters A, B, C and D represents a different data sequence. Each of the four data sequences represented in FIG. 5 may be of a different length, and each is preferably somewhat longer than 48 bits (the length of the "instruction" which signals the apparatus to expand data). As an example, we shall assume that data sequence A is twice as long as an expand instruction; that B is four times as long; that C is three times as long; and that D is five times as long. Also as an example, and for ease in description, we will regard the length of an expand instruction as being equal to one "unit". Thus, the sequence shown in the first line of FIG. 5 (comprising three A's, five B's, four C's and three D's) will occupy 53 units of storage if it is stored in uncompacted form.

The second line of FIG. 5 shows one manner in which this data could have been compacted for use in a system embodying this invention. The 15 data sequences have been compacted into four complete data sequences and nine expand instructions, comprising a total of 23 units of storage — almost a 57 percent saving. As shown in the second line of FIG. 5, each of the sequences A, B, C and D was included in its uncompacted form the first time that it was encountered. After that, each time that one of the sequences was encountered, it was replaced by a single expand instruction. In FIG. 5, each of the expand instructions is represented by four lines indicating the four fields of the instruction. The first line represents the flag which signals the apparatus that expansion is needed. The second line is the address of the beginning of the data which is to be inserted in place of the instruction. For purposes of this example it has been assumed that the data shown is located in contiguous storage locations beginning at location zero. Thus, if the data were to have been compacted as shown in the second line of FIG. 5, data segment A would begin at location zero, data segment B would begin at location two, data segment C would begin at location six and data segment D would begin at location nine. In the representations of instructions, the third line is the length of the string of data that is to replace the instruction. For data segements A, B, C and D the lengths are 2, 4, 3 and 5, respectively. Note that the last expand instruction, which has replaced the compound data segment CD, shows a length of eight, the sum of the lengths of C and D. The fourth line in the representations of the expand instruction shows the number of times that the data segment is to be inserted. For the instructions shown all of the counts equal one except for the count in the instruction which replaces the compound data segment BB, for which the count equals two.

The third line of FIG. 5 shows another manner in which the data could have been compacted prior to being utilized in a system embodying this invention. Instead of utilizing an uncompacted data sequence the first time that the sequence is encountered, each of the sequences A, B and C is not shown in expanded form until its second occurrence; the first occurrence of each of A, B and C is replaced by an expand instruction. In this example, the address of the beginning of each of the sequences A, B, C and D (assuming that the first expand instruction is at location zero) are locations 15, 11, 8 and 3, respectively. This alternative form of compaction enables the data sequence CBA to be replaced by a single expand instruction instead of the three instructions that were needed in the previous example. This latter example of compaction utilizes twenty-one units of storage: a saving of over sixty percent over the uncompacted data; and a saving of almost nine percent as compared to the first example.

Although the point is not illustrated in either of the above examples, those skilled in the art will recognize that savings in storage space can often be realized by including some repetitious data segments more than once. For example, if one had a situation where each of the compound data segments AB, AC and AD were repeated several times, it could be advantageous to include each of the three compound segments in its uncompacted form even though this would include three uncompacted A segments. Then, each of the three compound data segments could be replaced by a single expand instruction, resulting in a net saving of storage space.

As was mentioned above in the description of FIG. 1, an address which is transmitted from subroutine register 20 to SAR 6 may be incremented in an adder 24 by the contents of a base address register BAR 126. This incrementation will be particularly desirable in situations where, when the data are originally compacted, the address of the block of storage in which the data will ultimately reside is not precisely known. In these situations, the address information that will be put in the expand instructions will comprise, for each data segment, the displacement of that segment from the beginning of a larger block of data. When the block of data is loaded into storage 2, the storage address at which it begins will be loaded into BAR 26 via initial load line 64 so that, when expansion is needed, appropriate addresses may be provided through adder 24. By permitting blocks of data to be loaded into different portions of storage at different times, this enhances the flexibility of the system. An additional enhancement to system flexibility may be provided by including an option as to whether or not addresses contained in subroutine register 20 will be incremented by the contents of BAR 26. This can be accomplished by utilizing two different variations of the flag which identify the expand instruction. One flag will be used when the address contained in the expand instruction needs to be incremented by a base address and, in this case, the apparatus will function as has been described above. Another flag configuration can be used to indicate that the address contained in the expand instruction is an absolute address that requires no incrementation. In response to this latter flag, the decoder 12 can generate a signal which is fed via an inhibit line 66 to a gate 68 to prevent the contents of BAR 26 from being gated to the adder 24. Of course, other addressing schemes (for example, a virtual addressing system) could be used if desired.

Those skilled in the art will recognize that, in the embodiment described in detail herein, data that are referred to by an expand instruction should not contain another expand instruction. The advantages potentially available with this invention could be increased by providing the ability to have expand instructions within data that is, itself, referred to by an expand instruction. This could readily be accomplished by adding additional subroutine registers 20 in series with the one shown, and adding additional old address registers 22 in series with the one shown. If this were to be done, it would also be desirable to add some checking circuitry to insure tha the retention capability of the OAR and subroutine register stacks is not exceeded by successive expansion-within-expansion references. Such checking circuitry is not utilized in the embodiment described herein. One manner in which checking could be inserted would utilize a mode latch. When a flag is detected, the latch would be set to indicate expand mode. After expansion is completed, the latch would be reset. An error would be signalled if another flag was detected while the mode latch was set.

There are a large number of arrangements that could be used for compacting the data, all of which can be used as inputs to a system embodying this invention. For example, in some applications it might be practical to maintain in storage at all times a fixed set of data patterns (which could, but need not, comprise all of the data patterns required for the application). This would eliminate the need to repetitively reload such patterns into storage as the data in storage are exhausted and new data are requested.

Any suitable methodology may be used for compacting the data that are used as inputs to a system embodying this invention. In a system such as the one described in the Kruppa patent referred to above, the repetitive nature of certain data segments will be readily observed when the input data are created and can easily be compacted at that time.

Thos skilled in the art will also recognize that the "data" which are used as inputs to this system could be of various types such as, for example, numeric information or computer programs. If the using apparatus were to be the execution unit of a digital computer, for example, this invention could be utilized to cause the computer to execute a particular subroutine that is outside the sequential stream of instructions and to then automatically return to the sequential instruction stream.

Although the preferred embodiments of this invention recognize the end of a data expansion when both the length and count have been decremented to "one", those skilled in the art will recognize that other techniques, for example, decrementation to "zero" could also have been used. Furthermore, although this embodiment shows the use of a length register (32 in FIG. 2) which is decremented to determine when the end of an expansion data segment has been reached, the precise implementation of this portion of the invention will be determined to a large extent by the environment in which the invention is implemented. Again, details of such implementation are well known to those skilled in the art and need not be expanded upon herein.

In the above embodiment, length was decremented when storage was referenced. In a system wherein more than one unit of data is set into the SDR, decrementation of length would occur with each unit of data read from the SDR.

Although it will generally be desirable to have the capability of incrementing addresses contained in the subroutine register by the contents of a base address register, in a relatively simple system wherein the absolute address of each data segment is known beforehand, the inclusion of a base address register and an adder (26 and 24, respectively, in FIG. 1) might not be necessary.

Various requisites of any implementation of this invention, such as, for example, timing and gating signals, delays (to avoid "race conditions"), etc, will be dependent upon the details of the environment in which the invention is implemented. The size of the various fields in the expand instruction will depend upon details (such as op code structure, memory size, etc.) of the environmental system. Of course, the sequence of these fields could be charged if desired. Also, in many implementations, various aspects of the invention that are shown, most particularly, in FIGS. 1 and 2 will be somewhat distributed throughout the environmental system. For example, the decoder 12 (FIG. 1) would, in many cases, actually be integrated within the control store of a host system. The foregoing description of a preferred embodiment of the invention contains sufficient information so that one skilled in the art would be able to readily implement this invention in any given environment.

If this invention were implemented in a system wherein memory read operations are terminated by a readout from a memory location specified in a termination register, there would be no need for a length register (32 in FIG. 2) in the subroutine control. The end of the data section could be determined by adding the length held in the subroutine register to the starting address also contained therein. Alternatively, in such a system, the expand instruction could contain the ending address instead of the length. However the number of bits in a typical address is large enough (compared to the number of bits in a typical length field) so that compaction efficiency would be adversely affected if two complete addresses were used. Of course, the ending address (or, indeed, even the address used in the embodiment described in detail above) could be a partial address, but we prefer to avoid the slight additional complexities that would be added if partial addresses were to be used.

While the invention has been particularly shown and described with reference to a preferred embodiment thereof, it will be understood by those skilled in the art that the above and other changes in form and details may be made therein without departing from the spirit and scope of the invention.

What is claimed is:

1. Data expansion apparatus for processing data to be transmitted to a using device, comprising:
   storage means having an output and containing addressable storage locations storing a mixture of data and compact representations of data;
   said compact representations of data each including a coded flag signifiying that it is a compact representation;
   an address field identifying the initial location address in said stoarge means of a predetermined data sequence;
   a length field indicating the length of said sequence; and
   a count field indicating a predetermined number of repetitions of said sequence to be sequentially transmitted to said using device;

gating means connecting the output of said storage means to said using device for transmission of data from said storage means to said using device;

deconding means connected to the output of said storage means;

said decoding means being responsive to the occurrence of a flag at the output of said storage means to inhibit said gating means, thereby interrupting transmission of data from said storage means to said using device, said flag having been read from a storage location having an address $n$;

first register means;

means responsive to the occurrence at the output of said storage means fo said address field, said length field and said count field to cause said first register means to store indications of the initial location, the length and the number of repetitions, respectively, of said sequence;

means to cause transmission of said sequence from said storage means to said using device; and control means responsive to the completion of transmission of said sequence the number of repetitions indicated in said first register means to cause recommencement of storage access from the storage location which has and address of $n + i$, where $i$ equals the length of a compact representation of data.

2. The data expansion apparatus of claim 1 wherein said control means includes:

a length register;

means connecting said first register means to said length register to cause said length register to store said indication of the length of said sequence;

first decrementing means responsive to transmissions of data from said storage means to said using device to cause decrementation of said length register;

first detecting means connected to said length register for generating a first signal after said length register has been decremented to a first predetermined value;

means responsive to said first signal to cause said length register to again store said indication of the length of said sequence; and repeat means responsive to said first signal for causing retransmission of said sequence from said storage means to said using device.

3. The data expansion apparatus of claim 2, wherein said control means further comprises:

error detecting means connected to said first register means for generating an error signal in response to predetermined data configurations occurring in said first register means.

4. The data expansion apparatus of claim 2 wherein said control means further includes error detecting means comprising:

means for detecting a predetermined value occurring in one, but not both, of said length and number of repetition indications stored in said first register means.

5. The data expansion apparatus of claim 2 wherein said control means further includes:

a count register;

means connecting said first register means to said count register to cause said count register to store said indication of the number of repetitions of said sequence;

second decrementing means responsive to said first detecting means to cause decrementation of said count register each time said sequence is transmitted from said storage means to said using device;

second detecting means connected to said count register for generating a second signal after said count register has been decremented to a second predetermined value; and means connecting said second detecting means to said repeat means and to said second decrementing means in such manner that said second signal, when it occurs, will inhibit the operation of said repeat means and of said second decrementing means.

* * * * *